(12) United States Patent
Huang et al.

(10) Patent No.: US 8,890,607 B2
(45) Date of Patent: Nov. 18, 2014

(54) STACKED CHIP SYSTEM

(71) Applicants: Chao-Yuan Huang, Hsinchu (TW);
Yueh-Feng Ho, Hsinchu (TW);
Ming-Sheng Yang, Hsinchu (TW);
Hwi-Huang Chen, Hsinchu (TW)

(72) Inventors: Chao-Yuan Huang, Hsinchu (TW);
Yueh-Feng Ho, Hsinchu (TW);
Ming-Sheng Yang, Hsinchu (TW);
Hwi-Huang Chen, Hsinchu (TW)

(73) Assignee: IPEnval Consultant Inc., Hsinchu (TW)

( * ) Notice: Subject to any disclaimer, the term of this patent is extended or adjusted under 35 U.S.C. 154(b) by 0 days.

(21) Appl. No.: 13/835,055

(22) Filed: Mar. 15, 2013

(65) Prior Publication Data
US 2014/0266418 A1 Sep. 18, 2014

(51) Int. Cl.
*H01L 23/538* (2006.01)
*H01L 23/52* (2006.01)
*H01L 23/50* (2006.01)

(52) U.S. Cl.
CPC .................................. *H01L 23/50* (2013.01)
USPC ................... 327/565; 257/776; 257/E23.174; 438/12; 438/109

(58) Field of Classification Search
None
See application file for complete search history.

(56) References Cited

U.S. PATENT DOCUMENTS

| | | | |
|---|---|---|---|
| 8,110,892 B2 | 2/2012 | Lee et al. | |
| 8,193,006 B2 | 6/2012 | Chou et al. | |
| 8,310,382 B2 * | 11/2012 | Ide et al. | 341/100 |
| 8,339,879 B2 | 12/2012 | Choi et al. | |
| 8,384,417 B2 * | 2/2013 | Laisne et al. | 326/10 |
| 8,592,813 B2 * | 11/2013 | Sugawara | 257/48 |
| 8,593,170 B2 * | 11/2013 | Van der Plas et al. | 324/762.03 |
| 2010/0295600 A1 * | 11/2010 | Kim et al. | 327/365 |
| 2011/0156736 A1 | 6/2011 | Yun et al. | |
| 2011/0292742 A1 | 12/2011 | Oh et al. | |
| 2011/0309519 A1 * | 12/2011 | Kim | 257/774 |
| 2012/0007213 A1 | 1/2012 | Choi et al. | |
| 2012/0092062 A1 | 4/2012 | Lee et al. | |
| 2012/0104388 A1 | 5/2012 | Choi et al. | |
| 2012/0182042 A1 | 7/2012 | Jeong et al. | |
| 2012/0190133 A1 | 7/2012 | Abou-Khalil et al. | |
| 2012/0193806 A1 | 8/2012 | Or-Bach et al. | |
| 2012/0194228 A1 | 8/2012 | Choi | |
| 2012/0194243 A1 | 8/2012 | Choi et al. | |
| 2012/0195137 A1 | 8/2012 | Yun et al. | |
| 2012/0213022 A1 | 8/2012 | Yang et al. | |
| 2012/0286849 A1 | 11/2012 | Lee et al. | |
| 2013/0127028 A1 * | 5/2013 | Morimoto et al. | 257/666 |
| 2013/0207685 A1 * | 8/2013 | Ku | 324/762.01 |

\* cited by examiner

*Primary Examiner* — Lincoln Donovan
*Assistant Examiner* — Terry L Englund
(74) *Attorney, Agent, or Firm* — Alan Kamrath; Kamrath IP Lawfirm, P.A.

(57) ABSTRACT

A stacked chip system is provided to comprise a first chip, a second chip, a first group of through silicon vias (TSVs) connecting the first chip and second chip and comprising at least one first VSS TSV, at least one first VDD TSV, a plurality of first signal TSVs and at least one first redundant TSV and a second group of through silicon vias (TSVs) connecting the first chip and second chip and comprising at least one second VSS TSV, at least one second VDD TSV, a plurality of second signal TSVs and at least one second redundant TSV, wherein all the first group of TSVs are coupled by a first selection circuitry configured to select the at least one first redundant TSV and bypass at least one of the rest of the first group of TSVs, and wherein the at least one first redundant TSV and the at least second redundant TSV are coupled by a second selection circuitry configured to allow one of them to replace the other.

16 Claims, 5 Drawing Sheets

STACKED CHIP SYSTEM

FIELD OF THE INVENTION

The present invention relates to a stacked chip system and particularly to a stacked chip system using through-silicon vias.

BACKGROUND OF THE INVENTION

To save precious layout space or increase interconnection efficiency, multiple chips of integrated circuits (ICs) can be stacked together as a single IC package. To that end, a three-dimensional (3D) stack packaging technology is used to package the chips of integrated circuits. Through-silicon vias (TSVs) are widely used to accomplish the 3D stack packaging technology. A through-silicon via is a vertical conductive via completely passing through a silicon wafer, a silicon board, a substrate of any material or die. Nowadays, the 3D integrated circuit (3D IC) technology is applied to a lot of fields such as memory stacks, image sensors or the like.

Usually manufacturing a single chip of integrated circuits involve more than several hundred steps and failure of one of the steps or a tiny particle on the chip would destroy the chip. Applying 3-D integrated circuit (3D IC) technology does not make this situation better but worse due to much more extra steps needed, so there is a need to increase the fault tolerance of a chip thereby increasing the yield of a wafer.

SUMMARY OF THE INVENTION

A stacked chip system is provided to comprise a first chip, a second chip, a first group of through silicon vias (TSVs) connecting the first chip and second chip and comprising at least one first VSS TSV, at least one first VDD TSV, a plurality of first signal TSVs and at least one first redundant TSV and a second group of through silicon vias (TSVs) connecting the first chip and second chip and comprising at least one second VSS TSV, at least one second VDD TSV, a plurality of second signal TSVs and at least one second redundant TSV, wherein all the first group of TSVs are coupled by a first selection circuitry configured to select the at least one first redundant TSV and bypass at least one of the rest of the first group of TSVs, and wherein the at least one first redundant TSV and the at least second redundant TSV are coupled by a second selection circuitry configured to allow one of them to replace the other.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The following is the detailed description of the preferred embodiments of this invention. All the elements, sub-elements, structures, materials, arrangements recited herein can be combined in any way and in any order into new embodiments, and these new embodiments should fall in the scope of this invention defined by the appended claims. A person skilled in the art, upon reading this invention, should be able to modify and change the elements, sub-elements, structures, materials, arrangements recited herein without being apart from the principle and spirit of this invention. Therefore, these modifications and changes should fall in the scope of this invention defined only by the following claims.

There are a lot of embodiments and figures in this application. To avoid confusions, similar components are represented by same or similar numerals. To avoid complexity and confusions, only one of the repetitive components is marked. Figures are meant to deliver the principle and spirits of this invention, so the distance, size, ratio, shape, connection relationship, etc. are examples instead of realities. Other distance, size, ratio, shape, connection relationship, etc. capable of achieving the same functions or results can be adopted as equivalents.

Figure 1:
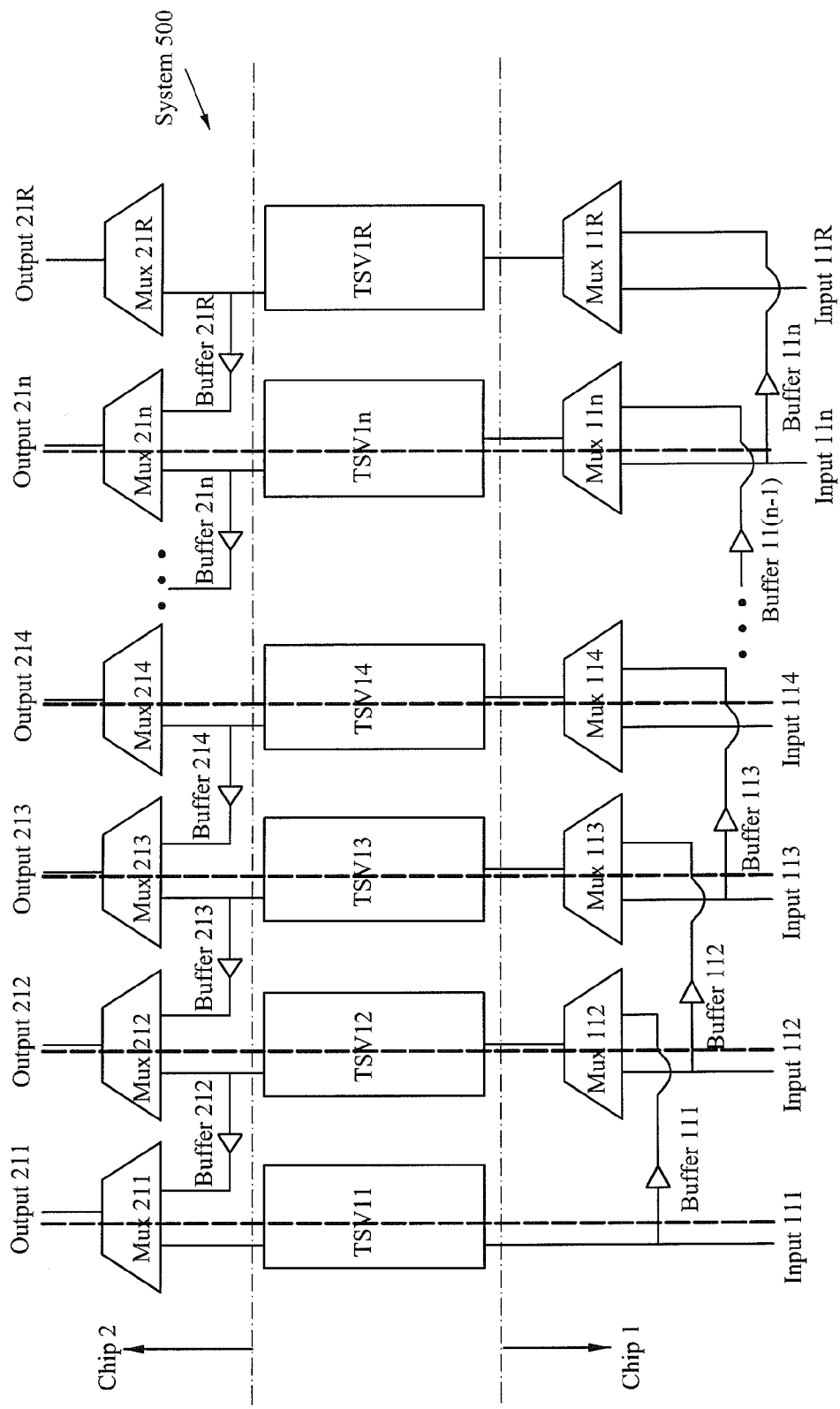
FIG. 1 shows a schematic view of a stacked chip system operating in normal mode in accordance with an embodiment of the present invention.

FIG. 1 shows a schematic view of a stacked chip system operating in normal mode in accordance with an embodiment of the present invention. System 500 comprises chips, chip 1 and chip 2, (or dies if they are not separated from their wafers yet) stacked together and multiple through-silicon vias (TSVs) coupling these two chips in electrically connection. TSV 11, TSV 12, TSV 13 ... TSV 1n and TSV 1R forms a first TSV group and they may all physically embedded within the chip 1 or chip 2. It is noted that the first group of TSVs should comprise at least one VSS TSV (one of TSV 11-TSV 1n), at least one VDD TSV (another one of TSV 11-TSV 1n), some signal TSVs (the rest of TSV 11-TSV 1n) and at least one redundant TSV (TSV 1R). VSS TSV is configured to couple operation voltage VSS (in most cases VSS can be electrical ground, but in some cases VSS is a voltage less than VDD in strength) to the integrated circuits (not shown) in the chip 2; VDD TSV is configured to couple positive operation voltage (VDD) to the integrated circuits (not shown) in the chip 2; and signal TSVs are configured to relay operational signals such as clock signal to the integrated circuits in the chip 2. In FIG. 1, chip 1 is the signal input side and chip 2 is the signal output side. However, the present invention is not limited thereto as long as one of chip 1 and chip 2 is the signal input side and the other one of chip 1 and chip 2 is the signal output side.

The system 500 also comprises multiple multiplexers (hereafter referred to as mux/muxes) within the chip 1 (mux 112, mux 113, mux 114 ... mux 11n and mux 11R), multiple multiplexers within the chip 2 (mux 211, mux 212, mux 213 ... mux 21n and mux 21R), multiple buffers within the chip 1 (buffer 111, buffer 112, buffer 113 ... buffer 11(n−1) and buffer 11n) and multiple buffers within the chip 2 (buffer 212, buffer 213, buffer 214 ... buffer 21n and buffer 21R). These TSVs, muxes and buffers route signal pathes and get the input signals (input 111, input 112, input 113 ... input 11n) to cross the chip boundary and become output signals (output 211, output 212, output 213 ... output 21n) respectively. It is noted that the muxes within chip 1 and chip 2 are controlled either by internal or external logic. Furthermore, for the two digits following a symbol such as TSV 11, the first digit represents its group and the second digit represents its position/order within the group; the second digit starts from one. TSV 1n means this TSV is the $n^{th}$ TSV in the first TSV group; TSV 1R means this TSV is the redundant TSV in the first TSV group. For the three digits following a symbol such as mux 113, the first digit represents its chip, the second digit represents its group and the third digit represents its position/order within the group; the third digit starts from one.

Still refer to FIG. 1, which shows the signal pathes (shown by thick dashed line - - - ) when all the TSVs are valid. Input 111 would go through TSV 11 and mux 211 and become output 211; input 112 would go through mux 112, TSV 12 and mux 212 and become output 212 . . . input 11n would go through mux 11n, TSV 1n and mux 21n and become output 21n. In this case, all the buffers, mux 11R, TSV 1R and mux 21R are not used.

Figure 2:
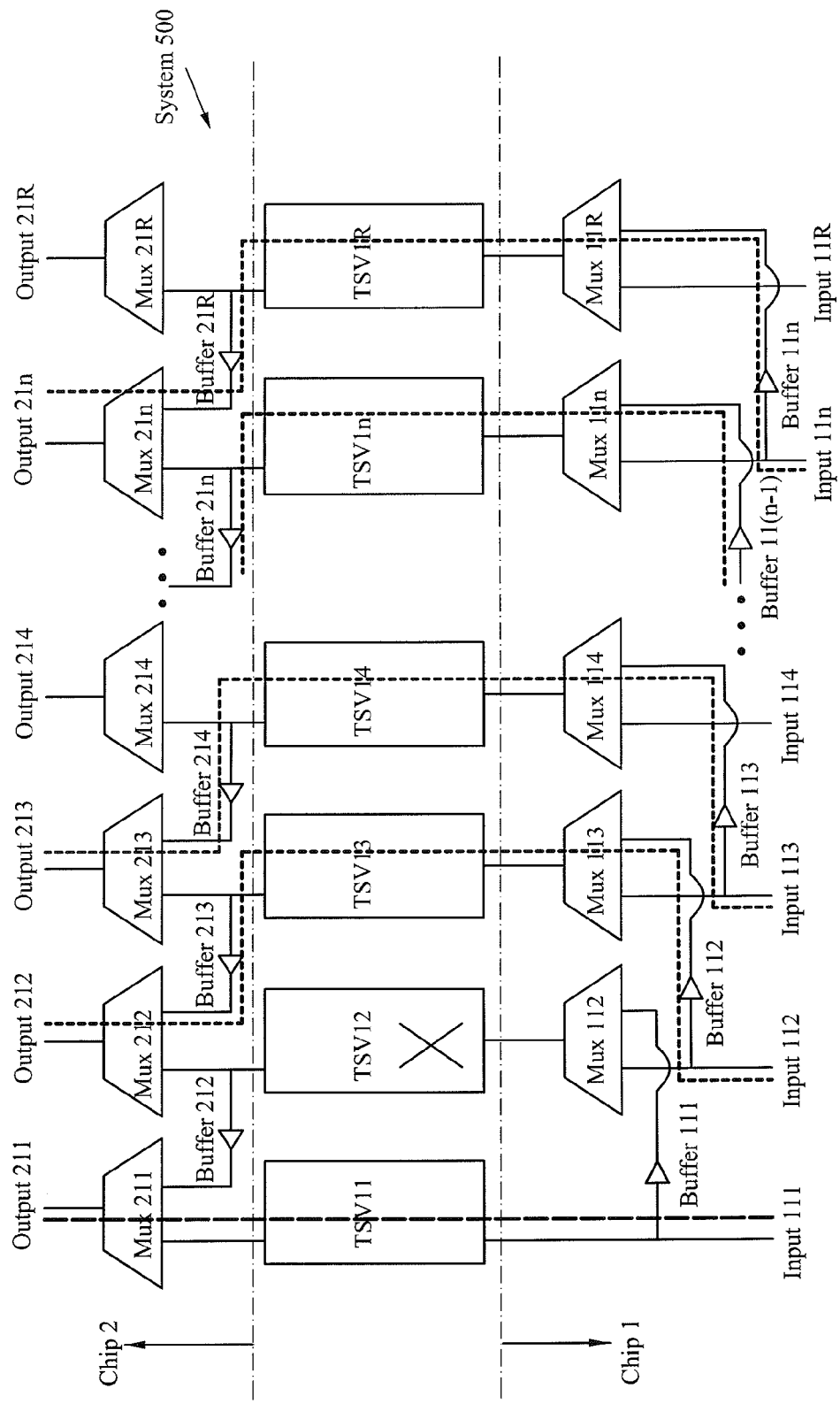
FIG. 2 shows a schematic view of a stacked chip system operating in defected mode in accordance with an embodiment of the present invention.

Now refer to FIG. 2, which shows a schematic view of a stacked chip system operating in defected mode in accordance with an embodiment of the present invention. In FIG. 2, the TSV 12 marked by a big "X" is invalid and can not be used to relay signal from chip 1 to chip 2. The muxes controlled by either internal or external logic would create new signal paths (shown by thick dashed line . . . ) to bypass the invalid TSV 12, select the redundant TSV 1R and reroute the input signals to where they supposed to arrive. In this case, input 111 still goes through TSV 11 and max 211 as usual but all other inputs (input 112, input 113 . . . input 11n) would be "shifted" to the next mux in chip 1 and goes through the next TSV. For example, input 112 would go through buffer 112, mux 113, TSV 13, buffer 213 and mux 212 and become output 212; input 113 would go through buffer 113, mux 114, TSV 14, buffer 214 and mux 213 and become output 213 . . . input 11n would go through buffer 11n, mux 11R, TSV 1R, buffer 21R and mux 21n and become output 21n.

Figure 3:
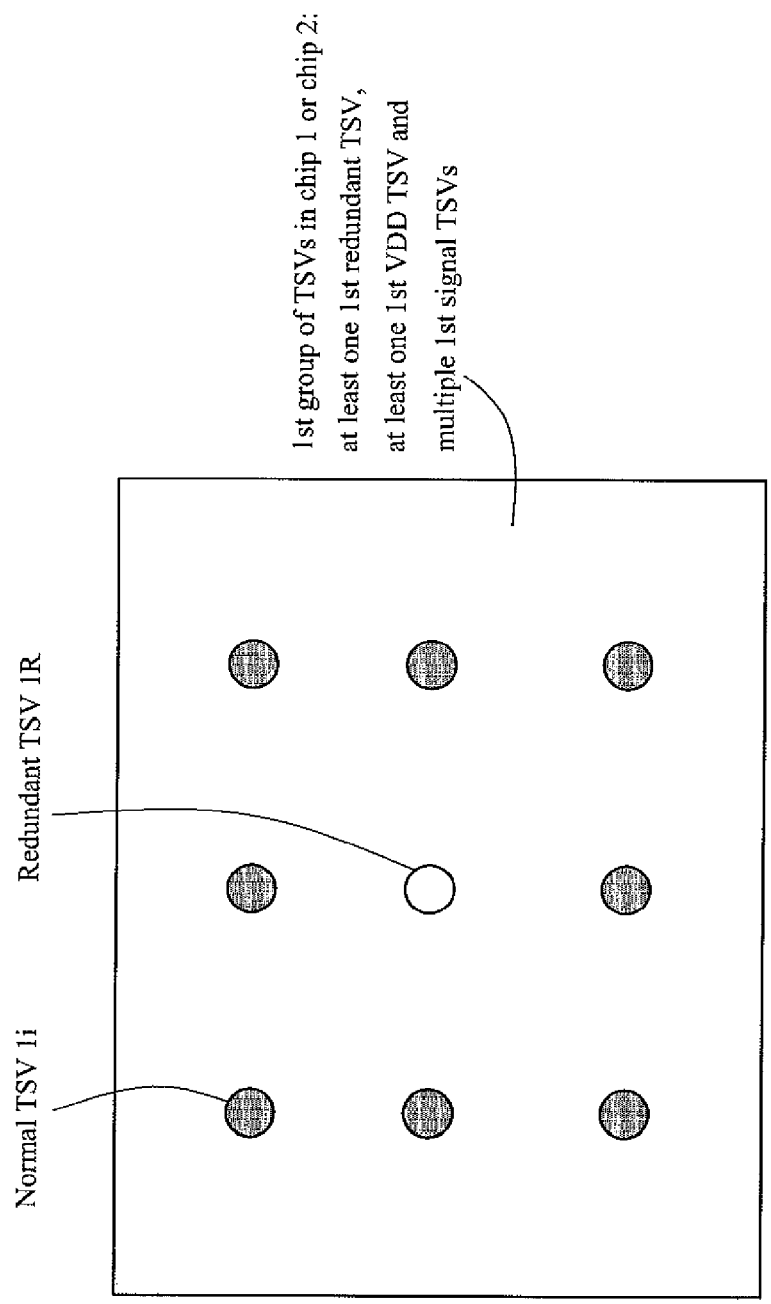
FIG. 3 shows a schematic top view of a group of through-silicon vias (TSVs) in accordance with an embodiment of the present invention.

Now refer to FIG. 3, which shows a schematic top view of a group of through-silicon vias (TSVs) in accordance with an embodiment of the present invention. The first group of TSVs is an example of one of the groups of TSVs. Each group of TSVs may form an array (3×3 array in FIG. 3 and the redundant TSV may be placed in the center of this array. In this case, TSV 1i can be on of TSV 11, TSV, 12 . . . TSV 18 and it could be a VSS TSV, a VDD TSV or a signal TSV. Refer to FIGS. 1-3, that means n is equivalent to 8. However, the present invention is not limited thereto, the array may be bigger (4×4, 3×4 . . . , that is having more TSVs) or smaller (2×2, 2×3 . . . , that is having less TSVs) as long as each array comprises at least one VSS TSV, at least one VDD TSV, at least one signal TSV and at least one redundant TSV.

Figure 4:
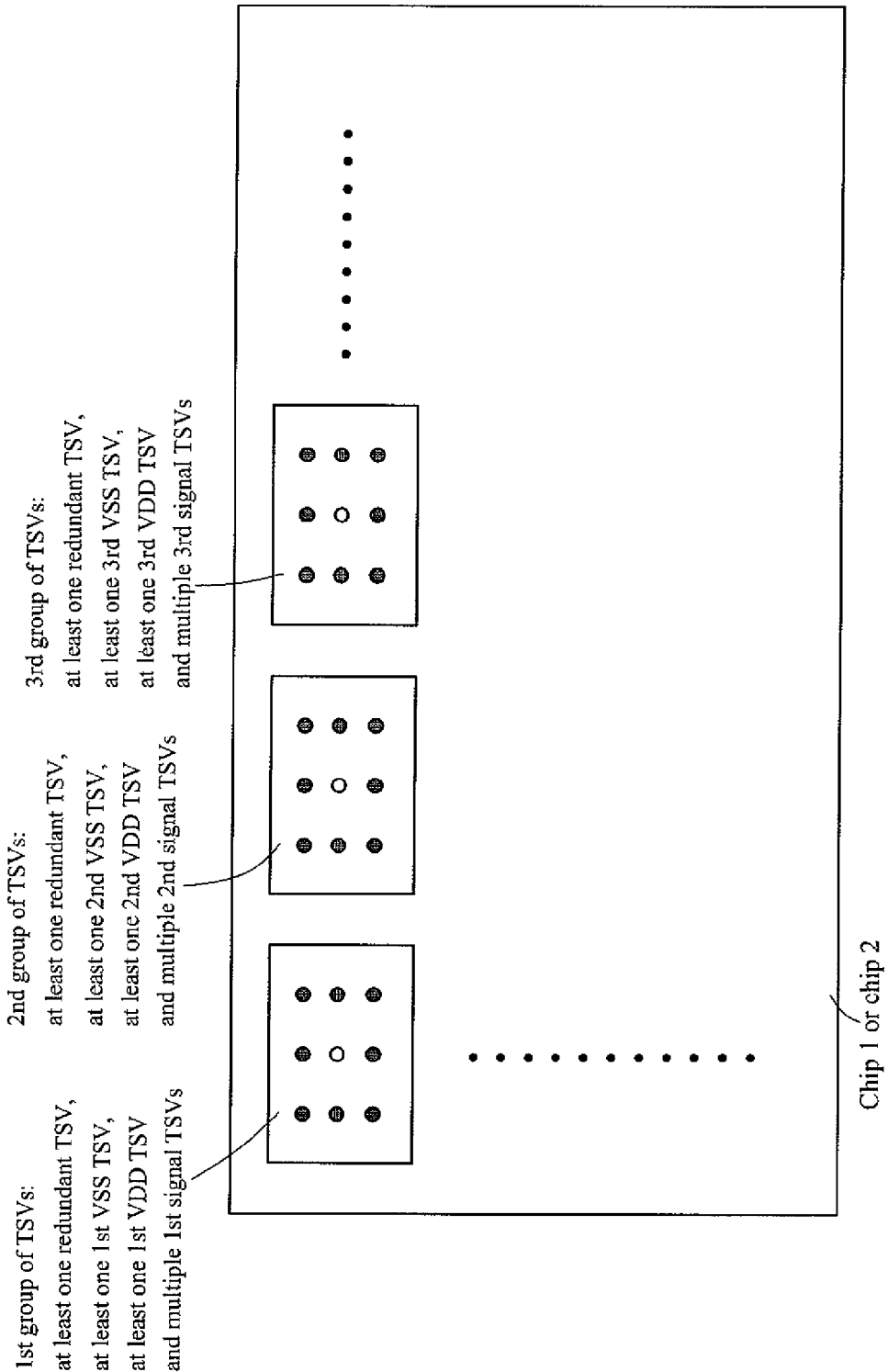
FIG. 4 shows a schematic top view of a chip comprising multiple groups of through-silicon vias (TSVs) in accordance with an embodiment of the present invention.

Now refer to FIG. 4, which shows a schematic top view of a chip comprising multiple groups of through-silicon vias (TSVs) in accordance with an embodiment of the present invention. As shown in FIG. 4, the chip 1 or chip 2 may comprise multiple groups of TSVs. Although these groups of TSVs are in the same size (all 3×3 arrays, that is having same amount of TSVs), the present invention is limited thereto. These groups of TSVs may have different sizes (that is having different amount of TSVs) as long as they can be arranged within the same chip without breaking design rule or causing manufacturing problems.

Figure 5:
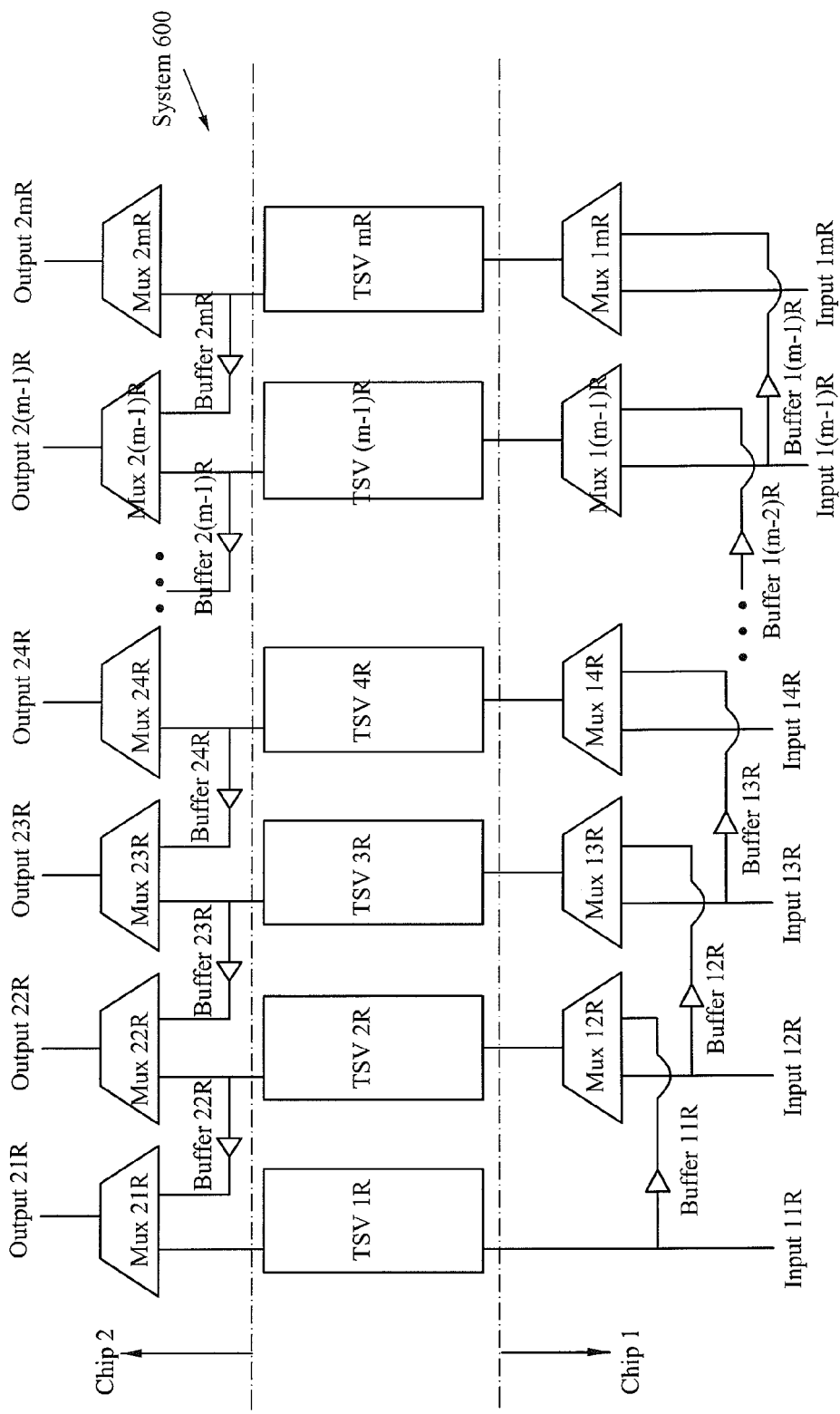
FIG. 5 shows a schematic view of a stacked chip system in accordance with another embodiment of the present invention.

Now refer to FIG. 5, which shows a schematic view of a stacked chip system in accordance with another embodiment of the present invention.

System 600 shown in FIG. 5 is very similar to the system 500 shown in FIGS. 1 and 2. Unlike system 500 connecting all the TSVs within the same group by muxes and buffers, system 600 connects all the redundant TSVs from different groups (TSV 1R from the first group, TSV 2R from the second group, TSV 3R from the third group . . . TSV mR from the $M^{th}$ group) together in the same way, so they can back up each other.

According to the present invention, the yield of stacked chip system can be improved by adding extra redundant TSVs and some control logic into one or both of the chips. By doing so, the redundant TSVs can replace invalid TSVs to deliver the complete functions.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stacked chip system, comprising:
   a first chip;
   a second chip;
   a first group of through silicon vias (TSVs) connecting the first chip and second chip, comprising at least one first VSS TSV, at least one first VDD TSV, a plurality of first signal TSVs and at least one first redundant TSV;
   a second group of through silicon vias (TSVs) connecting the first chip and second chip, comprising at least one second VSS TSV, at least one second VDD TSV, a plurality of second signal TSVs and at least one second redundant TSV,
   wherein all the first group of TSVs are coupled by a first selection circuitry configured to select the at least one first redundant TSV and bypass at least one of the rest of the first group of TSVs, and
   wherein the at least one first redundant TSV and the at least second redundant TSV are coupled by a second selection circuitry configured to allow one of them to replace the other.

2. The stacked chip system of claim 1, wherein the first group of TSVs form a first array.

3. The stacked chip system of claim 2, wherein the second group of TSVs form a second array.

4. The stacked chip system of claim 3, wherein the first array and second array have same amount of TSVs.

5. The stacked chip system of claim 3, wherein the first array and second array have different amount of TSVs.

6. The stacked chip system of claim 1, wherein the at least one of the rest of the first group of TSVs is invalid.

7. The stacked chip system of claim 1, wherein the first selection circuitry comprises a first amount of 2:1 multiplexers in the first chip and a second amount of 2:1 multiplexers in the second chip, wherein the first amount is different from the second amount.

8. The stacked chip system of claim 7, wherein the first amount is different from the second amount by one.

9. The stacked chip system of claim 1, wherein the first selection circuitry further comprises a first amount of buffers in the first chip and a second amount of buffers in the second chip, wherein the first amount is equivalent to the second amount.

10. The stacked chip system of claim 1, wherein the first group of TSVs form an array and the least one first redundant TSV is in the center of the array.

11. The stacked chip system of claim 1, wherein one of the first chip and second chip is a signal input side and the other one of the first chip and second chip is a signal output side.

12. The stacked chip system of claim 11, wherein the input side comprises a first amount of 2:1 multiplexers and the output side comprises a second amount of 2:1 multiplexers, wherein the second amount is larger than the first amount.

13. The stacked chip system of claim 11, wherein the input side comprises a first amount of buffers and the output side comprises a second amount of buffers, wherein the first amount is equivalent to the second amount.

14. The stacked chip system of claim 1, further comprising a third group of TSVs connecting the first chip and second chip, comprising at least one third VSS TSV, at least one third VDD TSV, a plurality of third signal TSVs and at least one third redundant TSV, wherein the at least one third redundant TSV is also coupled by the second selection circuitry configured to allow one of the first redundant TSV., the second redundant TSV and the third redundant TSV to replace another one of the first redundant TSV, the second redundant TSV and the third redundant TSV.

15. The stacked chip system of claim 14, wherein the second selection circuitry comprises multiple multiplexers in the first chip and multiple multiplexers in the second chip.

16. The stacked chip system of claim 14, wherein the second selection circuitry comprises multiple buffers in the first chip and multiple buffers in the second chip.

* * * * *